(12) United States Patent
Prunchak

(10) Patent No.: US 7,935,279 B2
(45) Date of Patent: *May 3, 2011

(54) GLASS FRITS

(75) Inventor: Robert Prunchak, East Windsor, NJ (US)

(73) Assignee: BASF SE, Ludwigshafen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/759,368

(22) Filed: Apr. 13, 2010

(65) Prior Publication Data

US 2010/0244205 A1 Sep. 30, 2010

Related U.S. Application Data

(63) Continuation of application No. 12/022,294, filed on Jan. 30, 2008, now Pat. No. 7,736,546.

(51) Int. Cl.
*H01B 1/08* (2006.01)
*C03C 8/14* (2006.01)
*C03C 8/16* (2006.01)
*H01L 29/12* (2006.01)

(52) U.S. Cl. .............. 252/519.4; 252/519.14; 252/500; 501/17; 501/18; 257/43

(58) Field of Classification Search ............ 252/519.14, 252/519.4, 500; 501/17, 18; 257/43
See application file for complete search history.

(56) References Cited

U.S. PATENT DOCUMENTS

| | | | |
|---|---|---|---|
| 5,162,062 A | 11/1992 | Carroll et al. | |
| 5,252,521 A | 10/1993 | Roberts | |
| 5,378,408 A | 1/1995 | Carroll et al. | |
| 5,439,852 A | 8/1995 | Hormadaly | |
| 5,468,695 A | 11/1995 | Carroll et al. | |
| 5,491,118 A | 2/1996 | Hormadaly | |
| 5,578,533 A | 11/1996 | Manabe et al. | |
| 5,714,420 A | 2/1998 | Sakoske et al. | |
| 5,753,571 A | 5/1998 | Donohue | |
| 5,795,501 A | 8/1998 | Kano | |
| 5,882,722 A | 3/1999 | Kydd | |
| 5,891,283 A | 4/1999 | Tani et al. | |
| 6,036,889 A | 3/2000 | Kydd | |
| 6,255,239 B1 | 7/2001 | Sakoske | |
| 6,348,426 B1 | 2/2002 | Sanada et al. | |
| 6,814,795 B2 | 11/2004 | McVicker et al. | |
| 7,138,347 B2 | 11/2006 | Konno | |
| 7,211,205 B2 | 5/2007 | Conaghan et al. | |
| 7,736,546 B2 * | 6/2010 | Prunchak | 252/519.14 |
| 2003/0224205 A1 | 12/2003 | Li et al. | |
| 2005/0037910 A1 | 2/2005 | Konno | |
| 2006/0231801 A1 | 10/2006 | Carroll | |
| 2006/0231803 A1 | 10/2006 | Wang et al. | |
| 2006/0289055 A1 | 12/2006 | Sridharan et al. | |
| 2006/0292938 A1 | 12/2006 | Schwenki et al. | |
| 2007/0138659 A1 | 6/2007 | Konno | |
| 2007/0187652 A1 | 8/2007 | Konno | |
| 2007/0215203 A1 | 9/2007 | Ishikawa et al. | |
| 2007/0253140 A1 | 11/2007 | Randall et al. | |
| 2008/0206488 A1 | 8/2008 | Chung et al. | |
| 2009/0188555 A1 | 7/2009 | Castillo et al. | |

FOREIGN PATENT DOCUMENTS

| | | |
|---|---|---|
| EP | 0064211 | 11/1982 |
| EP | 0761617 | 3/1997 |
| EP | 1506944 A1 | 2/2005 |
| EP | 1713094 A2 | 10/2006 |
| EP | 1801891 A1 | 6/2007 |
| EP | 2015367 | 1/2009 |
| FR | 2348897 | 11/1977 |
| JP | 2281082 | 11/1990 |
| JP | 3280414 | 12/1991 |
| JP | 06-057183 | 3/1994 |
| JP | 07126037 | 5/1995 |
| JP | 2000264676 | 9/2000 |
| JP | 2005/243500 | 8/2005 |
| JP | 2005247602 | 9/2005 |
| JP | 2005281171 | 10/2005 |
| JP | 2006225255 | 8/2006 |
| JP | 3853793 | 9/2006 |
| JP | 2007049087 | 2/2007 |
| JP | 2007-235082 | 9/2007 |
| WO | WO-01/54203 A2 | 7/2001 |
| WO | WO-02082466 | 10/2002 |
| WO | WO-03/045584 A1 | 6/2003 |
| WO | WO-03106573 | 12/2003 |
| WO | WO-2004067647 | 8/2004 |
| WO | WO-2006/008896 | 1/2006 |
| WO | WO-2006/093398 | 9/2006 |
| WO | WO-2006/132766 A2 | 12/2006 |
| WO | WO-2007/089273 A1 | 8/2007 |

OTHER PUBLICATIONS

English Translation of JP 2006-225255, Aug. 31, 2006.*
Sabo, C. J. et al., "Silver Thick Film Metallization for Photovoltaics Fired at 300 degrees C", Materials Engineering, Purdue University, pp. 59-65 (1985).*
"Non-Final Office Action", U.S. Appl. No. 12/022,358 Dec. 30, 2009, 22.
"Non-Final Office Action", U.S. Appl. No. 12/022,294 Sep. 11, 2009, 50.
"Non-Final Office Action in U.S. Appl. No. 12/022,403, dated Mar. 25, 2010", 31 pp.
"PCT Search Report", PCT/US09/032109 May 8, 2009 , 3.
"PCT Search Report", PCT/US2009/032112 May 11, 2009 , 3.
"PCT Search Report", PCT/US2009/032107 May 13, 2009 , 3.

(Continued)

*Primary Examiner* — Douglas Mc Ginty
(74) *Attorney, Agent, or Firm* — Diehl Servilla LLC

(57) ABSTRACT

Glass frits, conductive inks and articles having conductive inks applied thereto are described. According to one or more embodiments, glass frits with no intentionally added lead comprise $TeO_2$ and one or more of $Bi_2O_3$, $SiO_2$ and combinations thereof. One embodiment of the glass frit includes $B_2O_3$, and can further include ZnO, $Al_2O_3$ and/or combinations thereof. One embodiment provides for conductive inks which include a glass frit with no intentionally added lead and comprising $TeO_2$ and one or more of $Bi_2O_3$, $SiO_2$ and combinations thereof. Another embodiment includes articles with substrates such as semiconductors or glass sheets, having conductive inks disposed thereto, wherein the conductive ink includes glass frits having no intentionally added lead.

20 Claims, No Drawings

OTHER PUBLICATIONS

"Thomson Scientific, London, GB", *Database WPI Week 199205, XP002524727* 1992, 1-5, 8, 9 pgs.

"Thomson Scientific, London, GB", *Database WPI Week 199528, XP002526317* May 16, 1995, 1-8 pgs.

"Thomson Scientific, London, GB", *Database WPI Week 199101, XP002524728* 1991, 1-9 pgs.

"Thomson Scientific, London, GB", *Database WPI Week 200115, XP00252319* 2001, 1-9 pgs.

"Thomson Scientific, London, GB", *Database WPI Week 200566, XP002526320* 2005, 1-9 pgs.

"Thomson Scientific, London, GB", *Database WPI Week 200666, XP002526318* 2006, 1-9 pgs.

Vest, G. M. et al., "Copper films from aqueous solutions of copper nitrate trihydrate", *Thin Solid Films, Purdue University* Abstract 1991, 77-82.

Vest, G. M. et al., "MOD silver metallization for photovoltaics", *Energy Res. Abstr., Purdue Univ.* 1985.

Vest, M. G. et al., "Synthesis of metallo-organic compounds for metallo-organic decomposition (MOD) powders and films", *Materials Research Society Symposium Proceedings, Purdue University* Abstract 1986, 35-42.

\* cited by examiner

GLASS FRITS

CROSS-REFERENCE TO RELATED APPLICATIONS

This application is a continuation of U.S. application Ser. No. 12/022,294, filed Jan. 30, 2008, now U.S. Pat. No. 7,736,546, issued Jan. 15, 2010, which is incorporated herein by reference.

TECHNICAL FIELD

Embodiments of the invention relate to glass frits, conductive inks including a frit, and articles having such conductive inks applied thereto.

BACKGROUND

Conductive inks, obscuration enamels and decorative enamels typically use lead-based glass frits because they have a low melting range, low molten viscosity and stability against uncontrolled devitrification. Obscuration enamels are used in the automotive industry and conductive inks are used in the electronics industry, including in the manufacture of solar cells or photovoltaic cells.

Photovoltaic ("PV") cells convert sunlight into electricity by promoting charge carriers in the valence band of a semiconductor into the conduction band of the semiconductor. The interaction of photons in the sunlight and doped semiconductor materials form electron-hole pair charge carriers. These electron-hole pair charge carriers migrate in the electric field generated by the p-n semiconductor junction and collected by a conductive grid or metal contact printed or applied to the surface of the semiconductor, through which it flows to the external circuit. Crystalline silicon PV cells in today's industry are typically coated with an anti-reflective coating to promote light adsorption, which increases PV cells efficiency. However, the anti-reflective coating imposes high electrical resistance to the charge carrier flowing from the semiconductor to the metal contact. Such anti-reflective coatings often comprise silicon nitride, titanium oxide or silicon oxide.

Conductive inks are used to form these conductive grids or metal contacts. Conductive inks typically include a glass frit, a conductive species, such as silver particles, and an organic medium. To form the metal contacts, conductive inks are printed onto the substrate in a pattern of grid lines or other pattern by screen printing or other process. The substrate is then fired, during which electrical contact is made between the grid lines and the substrate. This contact is enhanced by the formation of individual silver crystallites at the glass-substrate interface. Without being bound by theory, it is believed that charge carriers are transferred from the substrate to the silver crystallites and then transferred to the gridline either through the glass layer by tunneling or directly to the silver of the gridline, if there is direct contact of the crystallite with both the gridline and the semiconductor. Lower firing temperatures are desirable in this process because of the lower cost involved and energy saved.

As otherwise mentioned herein, the anti-reflective coating enhances light absorption but also acts as an insulator which impairs the excited electrons from flowing from the substrate to the metal contacts. Accordingly, the conductive ink should penetrate the anti-reflective coating to form metal contacts having ohmic contact with the substrate. To accomplish this, conductive inks incorporate glass frits to aid with sintering silver particles to a substrate and to promote adhesion and ohmic contact between the formed metal contact and the substrate. When the glass frit liquefies, it tends to flow toward the interface between the silver particles and the anti-reflective coating on the substrate. The melted glass dissolves the anti-reflective coating materials as well as some of the metal particles and substrate. Once the temperature decreases, the molten silver and the melted or dissolved substrate recrystallize through the liquid phase. As a result, some of the silver crystallites are able to penetrate the antireflective layer and form ohmic contact with the substrate. This process is referred to as "fire-through" and facilitates a low contact resistance formation and a stronger bond between conductive grid or metal contact and the substrate.

The automotive, electronics and solar cell industries place greater emphasis on using environmentally-friendly components and processes. This emphasis has been further urged by the need to comply with environmental regulations. In response, the solar cell industry is moving to eliminate the use of lead in components and materials used in solar panels of cells.

Accordingly, there is a need for a lead-free glass frit which can be fired at a lower temperature and that can penetrate the anti-reflective layer and form metal contacts in ohmic contact with a substrate.

SUMMARY

Embodiments of the present invention relate to tellurium containing frits having no intentionally added lead and the uses thereof. According to one or more embodiments, the frits described herein have very low viscosity and are particularly corrosive. For example, in one or more embodiments, the frits tend to dissolve refractory materials typically used in PV applications as anti-reflective layers such as $SiO_2$, $TiO_2$ and $SiN_x$.

Specific embodiments include a frit having no intentionally added lead which includes $TeO_2$ and $Bi_2O_3$ and/or $SiO_2$. As used throughout this application, the terms "no intentionally added lead" and "substantially lead-free" shall mean a frit having lead in an amount less than about 1,000 ppm. In one or more embodiments, $TeO_2$ is present in an amount between about 0.01% by weight to about 10% by weight. Another embodiment also includes $B_2O_3$. According to one embodiment, the frit also includes at least one first oxide component. A second embodiment of the invention further includes at least one second oxide component, while a third embodiment includes at least one alkali metal oxide component. At least one alkaline earth metal oxide is included in another embodiment of the invention.

The first oxide component of one or more embodiments can include ZnO and/or $Al_2O_3$. ZnO is present in one embodiment in an amount of about 0% by weight to about 15% by weight, while the $Al_2O_3$ is present in an amount of about 0% by weight to about 3% by weight in another embodiment. The second oxide component of one embodiment includes $Ag_2O$, $Sb_2O_3$, $GeO_2$, $In_2O_3$, $P_2O_5$, $V_2O_5$, $Nb_2O_5$, and $Ta_2O_5$ and can be present in the following amounts: $Ag_2O$, $P_2O_5$, $V_2O_5$, $Nb_2O_5$, and/or $Ta_2O_5$ are present in an amount of about 0% by weight to about 8% by weight; $In_2O_3$ and/or $Sb_2O_3$ are present in an amount in the range from about 0% by weight to about 5% by weight; and $GeO_2$ is present in an amount in the range from about 0% by weight to about 10% by weight. Embodiments with at least one alkali metal oxide component utilize $Na_2O$, $Li_2O$, and/or $K_2O$ in an amount in the range from about 0% by weight to about 3% by weight, while embodiments with at least one alkaline earth metal oxide component utilize BaO, CaO, MgO and/or SrO in an amount in the range from about 0% by weight to about 8% by weight.

In accordance with another aspect of the present invention, a conductive ink includes a substantially lead-free frit having $TeO_2$ and $Bi_2O_3$ and/or $SiO_2$, along with a conductive species, and no intentionally added lead. One or more embodiments of the conductive ink include $TeO_2$ in an amount in the range from about 0.01% by weight to about 10% by weight. Another embodiment utilizes silver as a conductive species. In accordance with one or more embodiments, the conductive ink includes frits which also incorporate $B_2O_3$. Further conductive ink embodiments can have a frit which includes at least one first oxide component, at least one second oxide component, at least one alkali metal oxide component, and/or at least one alkaline earth metal oxide component. According to one embodiment, frit is present in the conductive ink in the amount in the range from about 1% by weight to about 5% by weight.

Another aspect of the invention includes an article comprising a substrate, and a conductive ink as described herein disposed on the substrate. According to one or more embodiments, the substrate is a semiconductor, a glass sheet and/or an enamel disposed on a glass sheet. Embodiments with a semiconductor substrate also include an anti-reflective layer disposed on the substrate with the conductive ink is disposed on the anti-reflective layer. In a more specific embodiment, the anti-reflective layer includes $SiO_2$, $TiO_2$ or $SiN_x$ In one or more embodiments of the article, the conductive ink comprises a substantially lead-free frit and a conductive species. In a specific embodiment, the frit includes $B_2O_3$ and $TeO_2$.

The foregoing has outlined rather broadly certain features and technical advantages of the present invention. It should be appreciated by those skilled in the art that the specific embodiments disclosed may be readily utilized as a basis for modifying or designing other structures or processes within the scope of the present invention. It should also be realized by those skilled in the art that such equivalent constructions do not depart from the spirit and scope of the invention as set forth in the appended claims.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Specific embodiments of the present invention include a frit having no intentionally added lead which includes $TeO_2$ and $Bi_2O_3$ and/or $SiO_2$. In one or more embodiments, $TeO_2$ is present in an amount between about 0.01% by weight to about 10% by weight. In a more specific embodiment, $TeO_2$ is present in an amount between about 0.5% by weight to about 5% by weight. In an even more specific embodiment, $TeO_2$ is present in an amount between about 0.5% by weight to about 2% by weight. In one or more embodiments, $Bi_2O_3$ is present in the frit in an amount in the range from about 40% by weight to about 95% by weight. In a specific embodiment, $Bi_2O_3$ is present in the range from about 50% by weight to about 80% by weight, while an even more specific embodiment has $Bi_2O_3$ in the range from about 60% by weight to about 75% by weight.

One or more embodiments of the frit include $SiO_2$ in an amount in the range from about 0% by weight to about 30% by weight. In specific embodiments, $SiO_2$ can be present in an amount in the range from about 1% by weight to about 4% by weight.

According to one or more embodiments, $B_2O_3$ is also included in the frit. In a specific embodiment, $B_2O_3$ is present in an amount in the range from about 0.1% by weight to about 10% by weight. In a more specific embodiment, $B_2O_3$ is present in an amount in the range from about 0.5% by weight to about 8% by weight. In an even more specific embodiment, $B_2O_3$ is present in an amount in the range from about 1% by weight to about 4% by weight.

One embodiment of the present invention includes a frit having $TeO_2$, $Bi_2O_3$, $SiO_2$, and $B_2O_3$. Another example of a frit includes $TeO_2$, $Bi_2O_3$, $SiO_2$, $B_2O_3$, ZnO and $Al_2O_3$. An additional embodiment of a frit includes 0.01% to 10% by weight of $TeO_2$, 40% to 95% by weight of $Bi_2O_3$, 0% to 30% by weight of $SiO_2$, 0.1% to 10% by weight of $B_2O_3$, 0% to 15% by weight of ZnO and 0% to 3% by weight of $Al_2O_3$. A further embodiment of the present invention includes a frit having $TeO_2$, $Bi_2O_3$, $SiO_2$, $B_2O_3$, ZnO and a second oxide component. One or more embodiments substitute ZnO with $Al_2O_3$, while another embodiment incorporates both ZnO and $Al_2O_3$.

One embodiment of the invention includes at least a first oxide component such as:
  ZnO in an amount in the range from about 0% by weight to about 10% by weight; and/or
  $Al_2O_3$ in an amount in the range from about 0% by weight to about 2% by weight.

Another embodiment of the invention incorporates at least one second oxide component including:
  $Ag_2O$ in an amount in the range from about 0% by weight to about 4% by weight;
  $Sb_2O_3$ in an amount in the range from about 0% by weight to about 4% by weight;
  $GeO_2$ in an amount in the range from about 0% by weight to about 4% by weight;
  $In_2O_3$ in an amount in the range from about 0% by weight to about 4% by weight;
  $P_2O_5$ in an amount in the range from about 0% by weight to about 4% by weight;
  $V_2O_5$ in an amount in the range from about 0% by weight to about 4% by weight;
  $Nb_2O_5$ in an amount in the range from about 0% by weight to about 4% by weight; and/or
  $Ta_2O_5$ in an amount in the range from about 0% by weight to about 4% by weight.

One or more embodiments of the present invention incorporate at least one alkali metal oxide component including:
  $Na_2O$ in an amount in the range from about 0% by weight to about 2% by weight;
  $Li_2O$ in an amount in the range from about 0% by weight to about 2% by weight; and/or
  $K_2O$ in an amount in the range from about 0% by weight to about 2% by weight.

Additional embodiments of the invention also include at least one alkaline earth metal oxide component such as:
  BaO in an amount in the range from about 0% by weight to about 4% by weight;
  CaO in an amount in the range from about 0% by weight to about 2% by weight;
  MgO in an amount in the range from about 0% by weigh to about 2% by weight; and/or
  SrO in an amount in the range from about 0% by weight to about 4% by weight.

One or more embodiments of the present invention include conductive inks which utilize the frits disclosed herein and a conductive species. In one or more embodiments, the conductive ink utilizes a conductive species such as silver in powdered or particulate form. In one or more embodiments, the silver particles can be spherical, flaked or amorphous or provided in a colloidal suspension. Other non-limiting examples of suitable conductive species include conductive metals such as gold, copper and platinum in powdered or particulate form.

The silver species used in one or more embodiments can be in the form of fine powders of silver metal or silver alloys. In other embodiments, some of the silver can be added as silver oxide ($Ag_2O$), silver salts such as silver chloride (AgCl), silver nitrate ($AgNO_3$) and/or silver acetate.

Conductive inks according to one or more embodiments of the present invention also incorporate bismuth tellurate and/or bismuth silicate powders. It has been found that the addition of bismuth tellurate and/or bismuth silicate powders can control crystallization of the glass frit by shifting the onset of crystallization to lower temperatures. While the present invention should not be bound by theory, it is believed that bismuth tellurate and/or bismuth silicate powders provide nucleation sites for crystal growth. In a photovoltaic application, the glass frit should penetrate through or dissolve the anti-reflective layer to enable the silver to form ohmic contact, however, controlling the aggressiveness of glass frit is desired to prevent it from penetrating through the junction of the semiconductor which would shunt the device. Other embodiments utilize other known phases which produce the same or similar effect as bismuth tellurate and/or bismuth silicate, such as titania, zirconia, phosphorous compound and others.

The conductive ink according to one or more embodiments may also include a liquid vehicle. It is believed that the liquid vehicle disperses the particulate components and facilitates transfer of the ink composition onto a surface. Specifically, the liquid vehicle, which, according to one or more embodiments, is composed of solvent(s) and dissolved organic resin(s), disperses the conductive species and frit to obtain an ink having suitable viscosity. In addition to influencing paste viscosity it is believed that the resin(s) improve the adhesion and green-strength of the paste after it has been deposited on the substrate and dried. Various liquid vehicles with or without thickening agents, stabilizing agents, surfactants, defoamers and/or other common additives are suitable for use in the preparation of the embodiments of the present invention. Exemplary liquid vehicles which can be used include alcohols (including glycols), esters of such alcohols such as the acetates, propionates and phthalates, for instance dibutyl phthalate, terpenes such as pine oil, terpineol and the like. More specific liquid vehicles include diethylene glycol monbutyl ether, terpineol, isopropanol, tridecanol, water, and 2,2,4-trimethyl-1,3-pentanediol monoisobutyrate. Some embodiments utilize vehicles that also contain volatile liquids to promote fast setting after application to the substrate.

Examples of suitable organic resins dissolved into the liquid vehicle include ethyl cellulose, methyl cellulose, nitrocellulose, ethyl hydroxyl ethyl cellulose, carboxymethyl cellulose, hydroxylpropyl cellulose and other cellulose derivatives. Other examples include resins such as acrylic acid esters, methacrylic acid esters, polyvinyl alcohols, polyvinyl butyrals, polyesters and polyketones.

In one specific embodiment, solutions of resins such as polymethacrylates of lower alcohols are used, while in a more specific embodiment, the liquid vehicle includes ethyl cellulose dissolved in solvents such as pine oil and monobutyl ether of diethylene glycol.

The ratio of liquid vehicle to solids in the conductive ink according to one or more embodiments can vary considerably and is determined by the final desired formulation viscosity which, in turn, is determined by the printing requirements of the system. In one or more embodiments, the conductive ink can contain about 50 to about 95% by weight solids and about 5 to about 50% by weight liquid vehicle.

One or more embodiments of the conductive inks may additionally comprise further additives known in the art, such as colorants and staining agents, rheology modifiers, adhesion enhancers, sintering inhibitors, green-strength modifiers, surfactants and the like.

In one or more embodiments of the present invention, a preservative is incorporated into the coating composition. Some embodiments utilize preservatives such as boric acid, phosphoric acid, hydrochloric acid, nitric acid, sulphuric acid and/or combinations thereof, while other embodiments utilize other preservatives known in the art.

Another aspect of the present invention pertains to articles including a substrate, and a conductive ink disposed on the substrate. One or more embodiments include a conductive ink having a frit as described herein, that is, a frit comprising $TeO_2$ and having no intentionally added lead. Examples of substrates include semiconductor wafers, glass sheets and other suitable substrates used in the photovoltaic industry for the formation of photovoltaic cells. In one embodiment, the semiconductor substrate is doped with phosphorous, while another embodiment includes doped conductive inks. According to one embodiment of the present invention, the semiconductor substrate comprises amorphous, multicrystalline or monocrystalline silicon.

In one or more embodiments, the semiconductor substrate has an anti-reflective coating disposed thereon and the conductive ink is printed on top of the anti-reflective coating. The anti-reflective coating according to some embodiments comprises silicon dioxide, titanium oxide, silicon nitride or other coatings known in the art.

Methods known in the art can be used to produce semiconductor substrates having a conductive ink disposed thereon. One or more embodiments employ crystalline silicon such can be either amorphous, monocrystalline or multicrystalline. Coatings may be applied to the substrates, and such coatings or layers can be produced according to known processes, such as chemical vapor deposition, plasma vapor deposition, and the like. The anti-reflective coatings can also be applied using chemical vapor deposition techniques. In some embodiments, plasma enhanced chemical vapor deposition techniques are used to dispose the anti-reflective coating on the substrate. Semiconductor articles, according to one or more embodiments, may also be etched or textured to reduce reflection of sunlight and enhance the level of light absorption. According to one or more embodiments, the conductive ink is thereafter applied to the surface of the substrate or anti-reflective coating by screen printing or other technique. The substrate is heated or fired to a temperature of about 750° to 850° C. to sinter the particles of the conductive ink into gridlines. As otherwise discussed in this application, the firing process allows the glass frit to melt and penetrate or dissolve the anti-reflective coating disposed on the substrate. In one or more embodiments, the conductive species forms crystallites at the interface of the frit and substrate interface, which enhances electrical or ohmic contact between the metal contacts formed from the conductive ink and the semiconductor substrate.

One or more embodiments of the invention include glass sheet substrates with conductive ink printed thereon. In a specific example, the glass sheet is an automotive backlite. In other examples, the glass sheet has an enamel disposed thereon and a conductive ink is printed on the enamel. Enamels used in some embodiments may be obscuration enamels which provide protection from ultra-violet rays which can deteriorate the adhesive glues that bond the automotive windshields to a vehicle body. Embodiments of glass sheet substrates may also include a pliable interlayer usually made up of polyvinyl butyrate ("PVB").

As with embodiments of the invention related to semiconductor articles with conductive ink disposed thereon, the conductive ink can be applied to the glass sheet substrate or enamel substrate by screen printing or other known method. In further embodiments, the substrates are fired heated or fired to a temperature of about 600° to 750° C. to sinter the particles of the conductive ink into grid lines.

Without intending to limit the invention in any manner, embodiments of the present invention will be more fully described by the following examples.

EXAMPLES

Two inks (Ink A and Ink B) were prepared having at least a frit and a conductive species. Inks A and B were prepared using a general procedure. The general procedure includes batching and dispersing the examples using triple roll milling. Alternative dispersion processes known in the industry such as bead milling, sand milling and colloid milling could also be used to disperse the solid particles in the organic binder medium.

Inks A and B both had a frit content of 3% by weight and silver in an amount of 97% by weight (on a solids basis). Both frits were bismuth borosilicate compositions, had similar coefficients of thermal expansion and glass transition temperatures. Ink A contained a frit known in the art which had no intentionally added lead. Ink B contained a frit known in the art which had no intentionally added lead and also incorporated $TeO_2$.

Eight textured, monocrystalline silicon wafers with a 40 ohm/square phosphorus doped emitter and boron doped base having a silicon nitride anti reflective coating were used. The back surfaces of the eight wafers were printed with commercially available back surface aluminum ink and silver rear contact ink. Both inks were thoroughly dried. Four wafers were then printed on the front surface with Ink A using a 325 mesh screen (Comparative Cells 1-4). Four additional wafers were printed on the front surface with Ink B in an identical manner (Cells 5-8). The PV cells were then dried and fired in an infrared furnace to a peak firing temperature as noted in Table 1. Each wafer was fired at the peak temperature for approximately 3 to 5 seconds. After cooling, the parts were tested for their current-voltage (I-V) characteristics.

TABLE 1

COMPARISON OF ENAMEL LAYERS

|  | Comparative Cell 1 | Comparative Cell 2 | Comparative Cell 3 | Comparative Cell 4 |
|---|---|---|---|---|
| Fill Factor (FF) | 0.467 | 0.523 | 0.494 | 0.562 |
| Efficiency (Eff) | 9.8 | 11.4 | 10.8 | 12.3 |
| Peak Firing Temp | 800° C. | 820° C. | 820° C. | 820° C. |
|  | Cell 5 | Cell 6 | Cell 7 | Cell 8 |
| Fill Factor (FF) | 0.519 | 0.659 | 0.659 | 0.681 |
| Efficiency (Eff) | 11.2 | 14.3 | 14.3 | 14.8 |
| Peak Firing Temp | 800° C. | 820° C. | 820° C. | 820° C. |

The "fill factor" and "efficiency" refer to measurements of the performance of a semiconductor. The term "fill factor" is defined as the ratio of the maximum power ($V_{mp} \times J_{mp}$) divided by the short-circuit current ($I_{sc}$) and open-circuit voltage ($V_{oc}$) in light current density-voltage (J-V) characteristics of solar cells. The open circuit voltage (Voc) is the maximum voltage obtainable at the load under open-circuit conditions. The short circuit current density ($J_{sc}$) is the maximum current through the load under short-circuit conditions. The fill factor (FF), is thus defined as $(V_{mp}J_{mp})/(V_{oc}J_{sc})$, where $J_{mp}$ and $V_{mp}$ represent the current density and voltage at the maximum power point. The cell efficiency, $\eta$, is given by the equation $\eta=(I_{sc}V_{oc}FF)/P_{in}$ where $I_{sc}$ equals the short circuit current, $V_{oc}$ equals the open circuit voltage, FF equals fill factor and $P_{in}$ is the power of the incident solar radiation.

The fill factor and efficiency of Cells 5-8, which contain $TeO_2$, was significantly higher than Comparative Cells 1-4, which did not contain $TeO_2$. This improvement was observed at both firing temperatures. Without being bound by theory, it is believed that the use of $TeO_2$ reduces the viscosity of the molten frit, thereby enabling the frit to penetrate, dissolve and/or digest the anti-reflective layer of the PV cell and improving ohmic contact between the silver or formed metal contact and the substrate cell.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A frit for a conductive ink for application to an anti-reflective coating on a semiconductor for use as a photovoltaic cell comprising:
    $TeO_2$; $Bi_2O_3$ in an amount in the range from about 40% by weight to about 95% by weight; and $SiO_2$, the frit containing no intentionally-added lead, such that upon firing at a temperature of about 750° C. to 850° C., the viscosity of the frit is reduced, enabling the frit to penetrate the anti-reflective coating to enable formation of ohmic contact between the conductive ink and the semiconductor.

2. The frit of claim 1, further comprising $B_2O_3$.

3. The frit of claim 2, further comprising at least one first oxide component selected from one or more of ZnO, $Al_2O_3$ and combinations thereof.

4. The frit of claim 2, further comprising at least one second oxide component selected from one or more of $Ag_2O$, $Sb_2O_3$, $GeO_2$, $In_2O_3$, $P_2O_5$, $V_2O_5$, $Nb_2O_5$, $Ta_2O_5$ and combinations thereof.

5. The frit of claim 2 further comprising at least one alkali metal oxide component selected from one or more of $Na_2O$, $Li_2O$, $K_2O$ and combinations thereof.

6. The frit of claim 2 further comprising at least one alkaline earth metal oxide component selected from one or more of BaO, CaO, MgO, SrO and combinations thereof.

7. The frit of claim 2, wherein the $TeO_2$ is present in an amount in the range from about 0.1% by weight to about 10% by weight.

8. A conductive ink comprising a substantially lead-free frit according to claim 1 and a conductive species.

9. The conductive ink of claim 8, wherein the frit further comprises $B_2O_3$.

10. The ink of claim 8, wherein the frit further comprises at least one first oxide component selected from one or more of ZnO and $Al_2O_3$.

11. The ink of claim 8, wherein the frit further comprises at least one second oxide component selected from one or more of $Ag_2O$, $Sb_2O_3$, $GeO_2$, $In_2O_3$, $P_2O_5$, $V_2O_5$, $Nb_2O_5$, and $Ta_2O_5$.

12. The ink of claim 8, wherein the frit further comprises at least one alkali metal oxide component selected from one or more of $Na_2O$, $Li_2O$, and $K_2O$.

13. The ink of claim 8, wherein the frit further comprises at least one alkaline earth metal oxide component selected from one or more of BaO, CaO, MgO and SrO.

14. The ink of claim 8, wherein the $TeO_2$ is present in the frit in an amount in the range from about 0.1% by weight to about 10% by weight.

15. The ink of claim 8, wherein the frit is present in amount in the range from about 1% by weight to about 5% by weight.

16. The ink of claim 8, further comprising one or more of bismuth tellurate and bismuth silicate, titania, zirconia, phosphorous compounds, and combinations thereof.

17. An article comprising a substrate, the conductive ink of claim 8 disposed on the substrate.

18. The article of claim 17, wherein the substrate comprises a semiconductor.

19. The article of claim 18, wherein an anti-reflective layer is disposed directly on the substrate and the conductive ink disposed on the anti-reflective layer.

20. A method of making a conductive ink for application to an anti-reflective coating on a semiconductor for use as a photovoltaic cell, the method comprising:
providing a frit comprising $TeO_2$, $Bi_2O_3$, and $SiO_2$, the frit containing no intentionally-added lead; and
dispersing the frit in a liquid vehicle including silver particles, such that that upon firing, the frit penetrates the anti-reflective coating to enable formation of ohmic contact between the conductive ink and the semiconductor.

* * * * *